United States Patent [19]

Benarr et al.

[11] Patent Number: 4,548,451

[45] Date of Patent: Oct. 22, 1985

[54] PINLESS CONNECTOR INTERPOSER AND METHOD FOR MAKING THE SAME

[75] Inventors: Garry M. Benarr, Wappingers Falls; Terry A. Burns, Poughkeepsie; William J. Walker, Wappingers Falls, all of N.Y.

[73] Assignee: International Business Machines Corporation, Armonk, N.Y.

[21] Appl. No.: 604,701

[22] Filed: Apr. 27, 1984

[51] Int. Cl.[4] ............................................. H01R 23/72
[52] U.S. Cl. .................... 339/17 M; 29/848; 339/61 M
[58] Field of Search ............. 339/17 F, 17 M, 17 LM, 339/59 M, 61 M; 29/846, 848

[56] References Cited

U.S. PATENT DOCUMENTS 3,924,915 12/1975 Conrad ........................... 339/61 M Primary Examiner—Neil Abrams
Attorney, Agent, or Firm—Wolmar J. Stoffel

[57] ABSTRACT

A pinless connector interposer for making densely populated, inexpensive, simple, reliable, self-wiping connections between components used in semiconductor packaging such as semiconductor carrying substrates, flexible and rigid printed circuit boards and cards. The connector interposer comprises an elastomeric base member in which deformable protrusions are formed on both the top and bottom surface of the base member, wherein the protrusions correspond to contact pads of semiconductor packaging components. An electrically conductive metal coated flexible overlay is bonded to the base member, forming electrically conductive tab elements, enabling a multitude of connections to be made to a semiconductor package. The connections can be accommodated on centers as low as 0.025 inches, despite the non-planarity that may exist between the packaging components of a system.

27 Claims, 4 Drawing Figures

PINLESS CONNECTOR INTERPOSER AND METHOD FOR MAKING THE SAME

DESCRIPTION

1. Technical Field

This invention relates generally to an electrical connector interposer, more particularly, to densely populated, pinless connectors and interposers of low contact resistance, which are primarily used for interconnecting semiconductor substrates and other electronic components which the substrate must electrically join with such as circuit boards, cards, or flexible printed circuit boards.

2. Background of Invention

Recent advances in semiconductor device processing and micro-circuit techniques have allowed for increased numbers of individual circuit elements on semiconductor devices. Advances in packaging these devices has also contributed to the present electronic industry trend towards large numbers of circuits being packaged in smaller and smaller volumes.

A modern semiconductor package typically comprises at least one or more semiconductor devices and a device carrying substrate which is usually connected to electrical components outside of the semiconductor package. While the size of these semiconductor packages is extremely small, the number of circuits per package is high and increasing. Thus the problem exists of providing numerous electrical connections in a small space, to communicate between the circuit elements on the substrate and the electrical system outside of the substrate, i.e. circuit boards, cards and flexible printed circuitry. One problem with forming such electrical connections is that the dimensions and physical tolerances of the connections to micro-circuit packages are extremely small and connectors or interposers to make such connections are difficult to reliably and inexpensively reproduce by conventional means. Another problem is that conventional techniques do not provide for simple engagement and separability of electronic packaging components. For example, a brazing or solder reflow operation is usually required when there are a multitude of dense connections. Such operations are expensive and the resulting electrical connections may be fragile under the stress of operation resulting from sources such as the thermal expansion mismatch between materials used for packaging components on either side of the connector or interposer. Another problem is that conventional connectors and interposers that are presently used in dense micro-circuit applications are rapidly reaching their limitations as far as density is concerned.

Among the most common means to secure electrical contact between components of a semiconductor package are pin and socket type connectors and edge connectors. These connectors become more difficult to manufacture and use as connections become more dense. Use is difficult due to the force required for engaging and separating such interposers or connectors. There is an insertion force associated with each pin or edge connected tab connection. As the number of connections increases, the total engagement and separation forces become unreasonably high. In addition, the cost for such connectors becomes increasingly high as density increases, due to expensive items such as pins, and expensive operations such as brazing which have associated high labor costs, and involve precious metals. A frictionless connection system also exists in the prior art, see U.S. Pat. No. 3,915,537, Harris et. al. Even though such a connection system eliminates the insertion and separation force problem, the system does not meet the connection density requirements anticipated for modern applications. Such systems, as the Harris patent demonstrates, require complex spring and socket mechanisms, and strict tolerances in order to be effective. It would be cost prohibitive to manufacture and assemble miniaturized connector system components to meet new and future density requirements. Also, pins, and brazing operations and the costs associated therewith are still required using frictionless connector systems.

Connectors and interposers have also been made by metal on elastomeric techniques. Such a connector is described in U.S. Pat. No. 4,008,300, Penn.

The metal on elastomeric connectors consist of electrical conductors that are embedded in the elastomeric. A major problem associated with such interposers is that existing manufacturing techniques do not provide a low cost method of production.

In addition, such interposers and connectors result in high contact resistances when used. State of the art metal on elastomeric interposers typically have contact resistances far above the range of resistances below 10 milli-ohms, which is the approximate limit of tolerable end of life contact resistance required for electronic packaging systems operating at anticipated applications with extremely high interconnection densities. In addition, external means and additional assembly time is required to guarantee sufficient wiping when state of the art metal on elastomeric connectors or interposers are used.

In view of the above, it is evident that a need exists for a connector interposer for semiconductor packaging applications that is are inexpensive, reliable, can be simply engaged and disengaged, that can facilitate a large number of connections per unit area, has a low end of life contact resistance, is self-wiping and easily manufacturable.

SUMMARY OF THE INVENTION

The electrical connector interposer of the present invention overcomes disadvantages of prior known constructions. It includes the features and advantages of providing a densely populated, highly reliable, low contact resistance, pinless connector interposer that is easily engaged and disengaged; enabling the contact pads on elements of integrated circuit packages, i.e. ceramic substrates, to connect with the contact pads of either rigid or flexible printed circuit boards or cards.

Briefly, the connector interposer comprises a means for making pinless connections, wherein the means is a separate entity from any of the components that it forms a connection between. The connector interposer comprises an elastomeric base member in which deformable protrusions are formed on both of its surfaces, wherein the protrusions correspond to contact pads on substrates and circuit boards or cards to which the substrates are joined. An electrically conductive metal coated flexible overlay is bonded to the base member, forming electrically conductive tab elements wherein each tab element is arranged with one end over a protrusion of the base member. An electroplated via or other conductive conduit is formed in the base member to complete an electrical connection between corresponding tab elements on each side of the elastomeric base member, thus completing the ultimate connection between contact pads on a semiconductor substrate and contact pads on a circuit board or card.

A large number of connections per unit area, i.e., high density, is available because the only physical limitations on the spacing between connections is the spacing between the deformable protrusions which is a function of the molding of the elastomeric base member, and the spacing between tab elements, which is a function of the state of the art in printed circuitry. The processes involved for molding the deformable protrusions, and creating printed circuitry are well defined, inexpensive and reliable. This allows us to achieve high densities that are practically achievable by using the present invention.

It is an object of the present invention to provide a connector interposer that provides a plurality of closely spaced pinless connections between the contact pads of substrates, circuit boards, cards and other components of semiconductor packages.

Another object of the present invention is to provide a connector interposer which will be inexpensive.

Another object of the present invention is to provide a connector interposer which will provide for low contact resistance connections.

Another object of the present invention is to provide a connector interposer that can be easily engaged and easily separated from the electronic packaging components that is will be used to connect.

Another object of the present invention is to provide for a connector interposer in which the reliability of connections made by using said connector interposer is improved.

Still another object of the present invention is to provide for a connector interposer which will automatically align itself and adjust to compensate, within limits, for the non-planarity of semiconductor package components being connected, such as substrates, circuit boards and cards.

Another object of the present invention is to provide for a connector interposer in which the resulting electrical connections will be self wiping.

Yet another object is to provide a method of manufacturing such a connector interposer.

The foregoing and other objects, features and advantages of the invention will be apparent from the following more particular description of the preferred embodiments of the invention, as illustrated in the accompanying drawings.

BRIEF DESCRIPTION OF THE DRAWINGS

The details of this invention will be described in connection with the accompanying drawings, in which.

DESCRIPTION OF THE PREFERRED EMBODIMENTS

Figure 1:
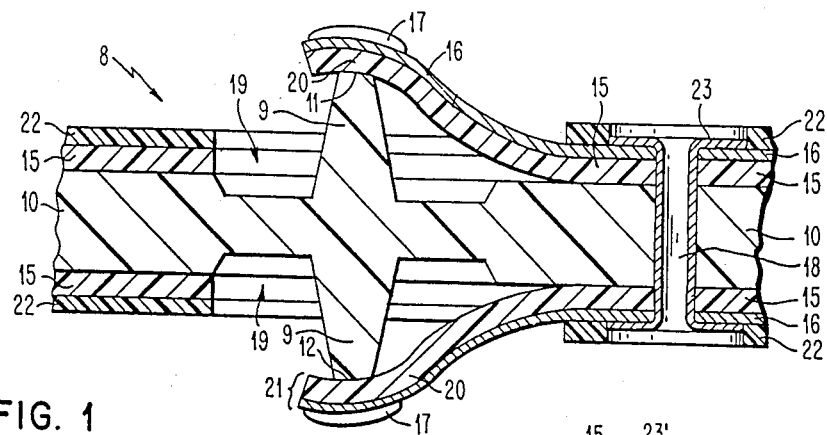
FIG. 1 is a view in side elevation in which the connector interposer is in its initial non-conducting position.

A pinless connector interposer for establishing a plurality of surface connections is described herein. Referring to FIG. 1, the connector interposer 8 constructed in accordance with the present invention is made up of a resilient base member 10, having sets of deformable protrusions 9 and surfaces 11 and 12 at the top and bottom of the deformable protrusions 9 respectively. Member10 may be formed from any suitable elastomeric dielectric material which maintains a uniform compressive force, i.e., silicone or polyurethane. The sets of protrusions 9 and surfaces 11 and 12 correspond to sets of gold coated contact pads 30 on the substrate of a semiconductor package 35 and a corresponding set of gold coated contact pads 31 on a supporting circuit board, flexible circuit board or card 33 (see FIG. 2). The typical spacings between sets of protrusion 9 are in the range of approximately 25 to 100 mils, though those skilled in the art will appreciate that the spacing between sets of protrusions 9 is limited only by the state of the art in elastomeric molding techniques.

As shown in FIG. 1, the base member 10 also has detent regions 19 formed in it, and is also provided with a flexible overly 15 which is selectively bonded to the base member 10, substantially everywhere except for the detent 19 and protrusion regions 19. The overlay 15 may be formed of flexible material preferably material from the family of thermoplastics which include polyimides and polyester.

The overlay 15 is provided with a number of flexible electrically conductive tab elements 21 which are arranged so that each tab element 21 has one end over a protrusion 9 of the base member 10. The tab elements 21 are formed from appendages 20 which are cut out on three sides, and lifted from flexible overlay 15. The length of each appendage 20 ranges approximately from 40 mils to 200 mils. Deposits of an electrically conductive material or printed circuit lines formed of an electrically conductive metal 16 such as copper are selectively deposited on the appendages 20, and on the flexible overlay 15 in the area surrounding openings 18 in the base member 10 so that conductors are provided where connections and conductive paths are desired. The combination of an appendage 20 and electrically conductive metal 16 comprises each tab element 21. Those skilled in the art will appreciate that the spacing between sets of tab elements 21 is limited only by the state of the printed circuit art.

In the present embodiment, a deposit of a noble metal, i.e., gold 17, is made on each of the flexible electrically conductive tab elements 21. The gold deposit 17 is made on the contact areas of the tabs wherein the contact area is the area of the flexible electrically conductive tab element 21 that lies directly above or below the top surface 11 and bottom surface 12 of the sets of protrusions. The range of diameters in which the gold deposit 17 may be applied are from approximately 6 to 30 mils and the thickness varies from a minimum of 0.1 mil and is ultimately determined by the required current carrying capacity. A flash of nickel is deposited over the tab elements 21 before applying the gold deposit 17.

The deposition of gold provides a reliable low resistance contact point between the contact area of the connector interposer and either the gold coated substrate mating pads 30 or the circuit board or card gold coated mating pads 31. Also, the gold is a corrosion inhibitor and provides a gas tight interconnection with gold coated mating pad 30 and gold plated mating pads 31 which provides for sufficient wiping action.

In the base member 10 are formed a multitude of openings 18, with electroplated coating 23 on the inside surface, which follows the contour of the openings 18 and extends to the outside of the openings 18. The electroplated coating 23 serves the purpose of completing the electrical connection between tab elements 21 on a first side of said base member 10, and associated tab elements 21 on a second opposite side. Alternative techniques to achieve electrical continuity are rivets, welding techniques, conductive polymers or other electrical conducting means.

Figure 3:
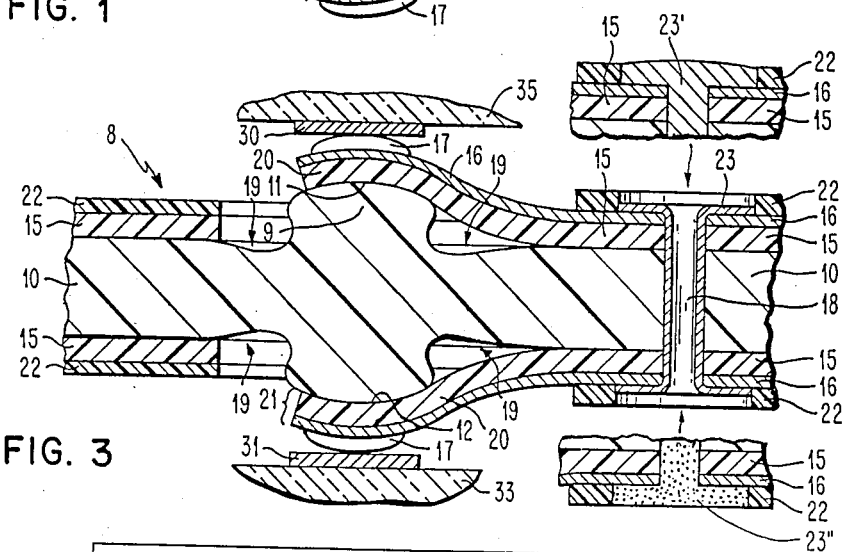
FIG. 3 is a view in side elevation in which the connector interposer is in its final, conducting position.
Figure 4:
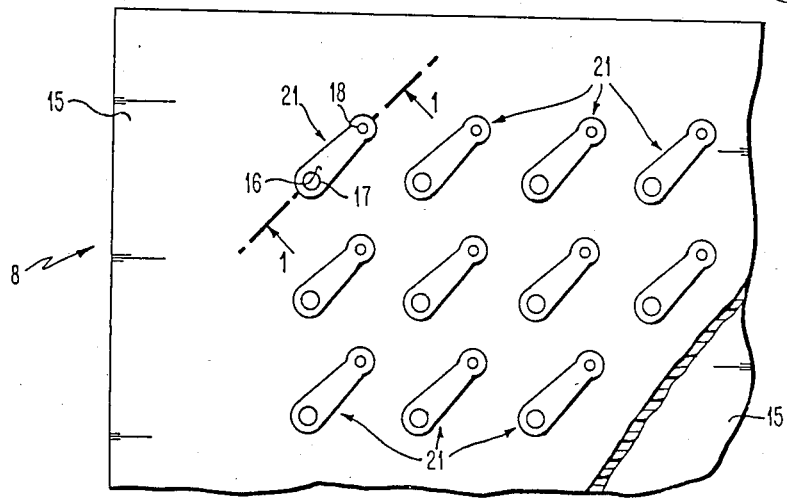
FIG. 4 represents the top view of the connector interposer fabricated in accordance with the present invention, wherein a plurality of individual connector elements are shown.

An insulating layer 22 is deposited over the flexible overlay 15 in the area lying between connector interposers 8 as shown in FIG. 4 and over the electrically conductive metal 16 in the area surrounding openings 18 in the base member 10 as shown in FIGS. 1 and 3. The insulating layer 22 is made up of a dielectric material, i.e. polyimide.

When the connector interposer 8 is in its initial, non-conducting position as shown in FIG. 1, the sets of deformable protrusions 9 are in an undeformed state, and the electrically conductive tab elements 21 rest on the undeformed protrusions 9 and are suspended above detent region 19. Alternatively, the tab elements 21 may be attached to the protrusions 9.

When a compression force is applied to the associated elements, i.e. board 33 and substrate 35, the gold contact points 17 of the connector interposer 8 make contact with both the gold coated contact pads 30 or the substrate 35 and the corresponding gold coated contact pads 31 of the circuit board or card 33 that the substrate connects with.

A relatively small engagement force is required to achieve sufficient localized pressure at the contact points due to the small contact area.

The compression also results in the deformation of the deformable protrusions 9, as shown in FIG. 3. Such deformations compensate for any vertical tolerance discrepancies resulting from the non-perfect manufacture of circuit boards, cards, substrates, and the contact pads of any of these components. Due to this compensation, individual seating for each contact can be accomplished, and the interposer connector self adjusts for the non-planarity of any mating components as described above. In addition, the deformation of the deformable protrusions 9 causes the gold plated contact point 17 to shift, which causes a wiping action of at least 10 mils between the contact points 17 of the connector interposer 8, and the corresponding substrate contact pads 30 and the circuit board or card contact pads 31.

Also occurring during the deformation of the deformable protrusions 9, the corresponding electrically conductive tab elements 21 are compressed, and lie over and into the area of detent region 19.

The conductive path between the conductive tab elements 21 on the first side of the base member 10 and the corresponding opposite side conductive tab elements 21 is completed through the electroplated coating 23. Other embodiments may utilize rivets 23', conductive pastes 23", or other conductive means to complete this conductive path. The contact resistance for the interposer connector 8 described in this embodiment is approximately 5 milli-ohms.

During the sustained use of the connector interposer 8, there is no problem of connection failure due to the thermal expansion mismatch between computer system components such as substrates, which may be made of ceramic material, and cards, which may be made of fiberglass. The fact that pins and associated solder or brazing joints are replaced by the flexible system described herein provides us with this advantage.

To either repair or rework an electrical system in which the connector interposer of the present invention is used, separation of the components is accomplished simply by disconnecting or unlatching any compressive force means, and exposing and removing the interposer connector. This relatively simple process is possible because there are no solder epoxy or other permanent joints incorporated into the present invention.

A method for producing the pinless connector interposer 8 shown in FIG. 1 is now described. Base member 10, including the deformable protrusions 9 and detents 19 therein, may be molded by conventional elastomeric molding techniques.

Conventional flexible printed circuit manufacturing techniques are used to form a plurality of flexible electrically conductive tab elements 21. The tab elements 21 are to be formed on only one side of flexible overlay 15, providing single side conductor exposure. Exemplary of a conventional printed circuit manufacturing technique which can be used to form a pattern of electrically conductive metallization 16 upon the flexible overlays 15 and appendages 20 is the following:

Deposit an electrically conductive metal such as copper 16 on flexible ovelay 15 and appendages 20. A pattern of printed circuitry may then be produced by conventional chemical etching processes. When chemical etching is used, photoresist may be selectively applied over the deposited copper to form the desired circuit pattern on the appendages 20 and overlay 15. The photoresist is then exposed and developed, and unwanted copper is etched away, leaving the resultant flexible electrically conductive tab elements 21, and flexible overlay 15 with copper deposits 16 located in the area surrounding openings 18.

As an alternative to the subtractive chemical etching process described above, conventional additive processes may be used to deposit copper 16 on the flexible overlays 15 and appendages 20. This may be done by depositing the copper 16 directly to the appendages 20 and flexible overlays 15 through a mask by conventional vapor deposition or electro depostiion techniques. By employing either the substitute chemical etching process, or additive direct deposition processes, a large number of flexible electrically conductive tab elements 21 may be produced on a flexible overlay 15 in one operation.

The flexible overlay structure 15, and electrically conductive tab elements 21 are selectively bonded to the top surface and bottom surface of the base member 10. The bonding may be accomplished by lamination or alternatively, by use of an adhesive.

Openings 18 are formed in the base member 10, through aligned areas of the flexible overlay 15. The openings are electroplated to form a continuous electroplated coating 23 inside of the openings 18 and around the outside of the openings, such that the electroplated coating 23 makes contact with the electrically conductive metallization 16 of the tab elements 21. Alternatively, rivets, conductive pastes or other current carrying means may be inserted into the formed openings to complete the electrical connection between the flexible electrically conductive tab elements 21 on the top and bottom of said base member 10.

Gold or another noble metal is then selectively deposited on the flexible electrically conductive tab elements 21, so that contact points 17 are formed. Conventional plating or sputtering techniques may be used to make these deposits.

In summary, the connector interposer 8 described herein provides for an inexpensive means to provide for dense, low contact resistance connections in semiconductor packages. The dense connections are possible because of the structure and function described above. The elimination of expensive pins and the operations associated with manufacturing and installing such pins significantly reduce the cost of each electrical connection. Other advantages are that the connector interposer provides for self-wiping action, and for simple assembly of non-planar components, i.e., circuit cards, boards and substrates. Also, rework and repair of semiconductor packages and components thereof is made simple because connections which are made by using the present interposer connector can be engaged or disengaged by application of a relatively small force and the connections are not soldered together. Reliability of the connector interposer and electrical connections using the same is increased due to the simple structure used, the non-existance of high failure rate items such as brazed pins and the ability of the connector interposer to compensate for the thermal expansion mismatch between semiconductor package components during operation.

While the invention has been particularly shown and described with reference to the preferred embodiments thereof, it will be understood by those skilled in the art that various changes in form and details may be made therein without departing from the spirit and scope of the invention.

What is claimed is:

1. A pinless connector interposer for establishing a plurality of surface connections between a set of closely spaced contact pads on the substrate of a semiconductor package and a corresponding set of contacts on a supporting rigid or flexible printed circuit board or card, comprising;
    a base member of elastomeric dielectric material,
    sets of deformable protrusions on both sides of said base member, the positioning of a first set of protrusions on a first side of said base member arranged in columns and rows and corresponding to one of said sets of contact pads on said substrate of said semiconductor package, and the positioning of a second set of protrusions on a second opposite side of said base member arranged in columns and rows and corresponding to one of said sets of contact pads on said supporting printed circuit board or card,
    a flexible overlay secured to each of said first and second sides of said base member,
    a plurality of electrically conductive elements on each of said flexible overlays with end portions of each of said conductive tab elements located over one of said deformable protrusions, and the opposite end portion of each of said conductive tab elements terminating in spaced relation to the associated deformable protrusions,
    a plurality of aligned openings through said base member, and each of said flexible overlays,
    conductive means extending through said aligned openings in said base member and overlays for electrically connecting each opposite end of an electrically conductive tab element of an overlay on said first side of said base member to a corresponding electrically conductive tab element of the overlay on said second opposite side of said base member.

2. The connector interposer of claim 1 wherein said base member has detent regions underlying at least a portion of said conductive tab elements, said detent regions being substantially adjacent to said deformable protrusions.

3. The connector interposer of claim 1 wherein said deformable protrusions are comprised of an elastomeric material, and project above the surface of said base member by at least 20 mils.

4. The connector interposer of claim 1 wherein the spacing between each of said deformable protrusions is in the range of 25 to 100 mils.

5. The connector interposer of claim 1 wherein said flexible overlay is formed of a resilient thermoplastic material, and is selectively bonded to said elastomeric dielectric material, forming an integral unit.

6. The connector interposer of claim 1 wherein said flexible overlay is formed of a polyimide material.

7. The connector interposer of claim 1 wherein said flexible overlay is formed of a polyester material.

8. The connector interposer of claim 1 wherein said electrically conductive tab elements comprise;
    appendages integrally formed in said overlay and depositions of electrically conductive metal which are deposited on said appendages, whereby flexible electrically conductive tab element are formed.

9. The connector interposer of claim 8 wherein said electrically conductive metal depositions form printed circuit patterns.

10. The connector interposer of claim 1 wherein said electrically conductive tab elements further include a deposition of a noble metal on the contact areas of said electrically conductive tab elements, whereby contact points are formed.

11. The connector interposer of claim 10 wherein said noble metal is gold.

12. The connector interposer of claim 1 wherein said means for electrically connecting each opposite end of an electrically conductive tab element of an overlay on said first side of said base member to a corresponding tab element of the overlay on said second opposite side of said base member is an electrically conductive metal layer on the surface of said opening in said base member and each of said aligned openings in said overlays.

13. The connector interposer of claim 1 wherein said means for electrically connecting each opposite end of an electrically conductive tab element of an overlay on said first side of said base member to a corresponding tab element of the overlay on said second opposite side of said base member is a conductive cylinder within said opening in said base member and said aligned openings in said overlays.

14. The connector interposer of claim 1 wherein said means for electrically connecting each opposite end of an electrically conductive tab element of an overlay on said first side of said base member to a corresponding tab element of the overlay on said second opposite side of said base member is a conductive paste in said openings in said base member and said openings in said aligned openings in said overlays.

15. A method of making a pinless connector interposer comprising the steps of:

forming a base member of elastomeric dielectric material, said base member having a plurality of protrusions, forming overlays of flexible material for the top and bottom sides of said base;

forming electrically conductive tab elements on one side of each of said overlays, selectively securing said overlays and conductive tab elements to both the first top side of said base member, and to the second bottom opposite side of said base member, forming substantially aligned openings through said conductive tab elements on said first and said second sides of said base member, and portions of said overlays on said first and second sides of said base member, providing conduction means through said openings in said base member and said portions of said overlay on said first and second sides of said base member which will make an electrical connection between corresponding conductive tab elements on said first side of said base member, and on the second opposite side of said base member.

16. The method of claim 15 wherein said base member is formed by molding.

17. The method of claim 15 wherein detents are formed substantially adjacent to said protrusions of said base member.

18. The method of claim 17 wherein said securing of said overlay and conductive tab elements to said first and second sides of said base member occurs substantially over the entire surface of said base member, except in the areas adjacent to and including said detents.

19. The method of claim 17 wherein said securing of said overlay and conductive tab elements to said first and second sides of said base member occurs substantially over the entire surface of said base member, except in the areas adjacent to and including said protrusions and said detents.

20. The method of claim 15 wherein said electrical conductor means is provided for by electroplating said opening formed in said base member, and said overlays.

21. The method of claim 15 wherein said electrical conduction means is provided for by filling said opening formed in said base member and said overlays with conductive paste.

22. The method of claim 15 wherein said electrical conduction means is provided for by inserting a solid conductor into said opening formed in said base members and said overlay.

23. The method of claim 15 wherein a noble metal is selectively deposited on said electrically conductive tab elements whereby contact pads are formed.

24. The method of claim 15 wherein the electrically conductive tab elements are formed by providing appendages in said overlay and depositing electrically conductive metal patterns on said appendages.

25. The method of claim 24 wherein electrically conductive metal patterns are formed by depositing electrically conductive metal on said appendages and chemically etching the desired pattern.

26. The method of claim 24 wherein electrically conductive metal patterns are formed by selectively vapor depositing electrically conductive metal on said appendages, so that the desired pattern is formed.

27. The method of claim 24 wherein electrically conductive metal patterns are formed by selectively electro-depositing electrically conductive metal on said appendages, so that the desired pattern is formed.

* * * * *

UNITED STATES PATENT AND TRADEMARK OFFICE
CERTIFICATE OF CORRECTION

PATENT NO. : 4,548,451

DATED : October 22, 1985

INVENTOR(S) : Garry M. Benarr, Terry A. Burns, and William J. Walker

Figure 2:
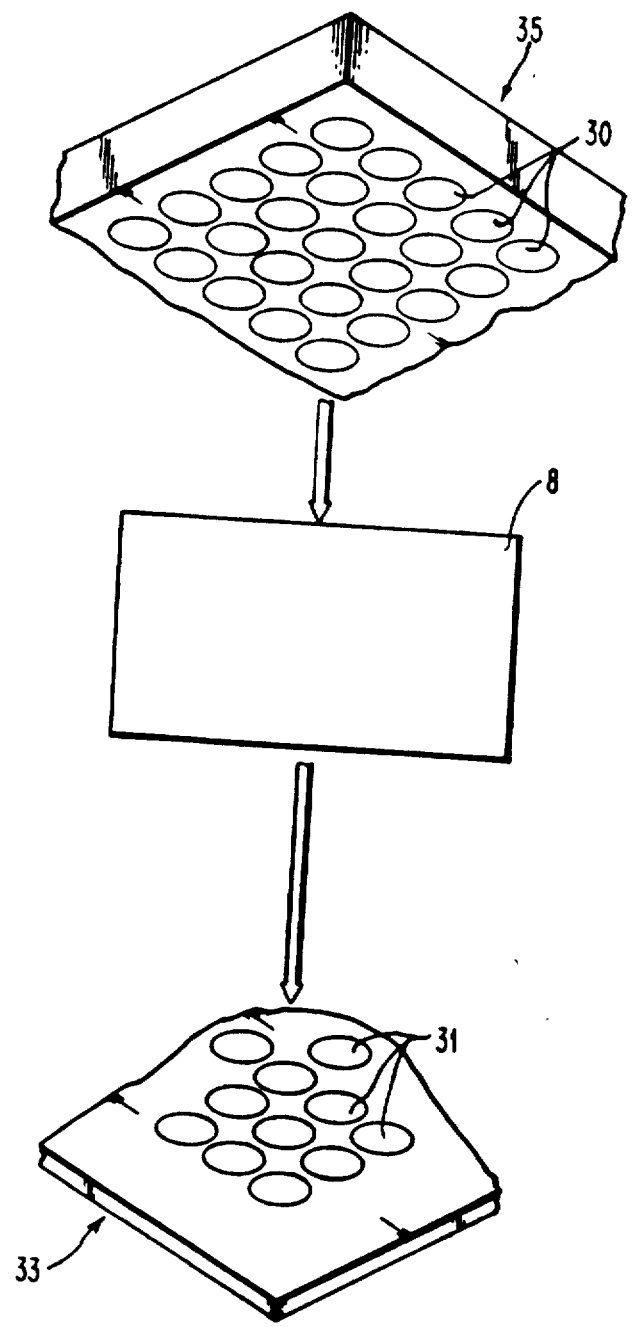
FIG. 2 is a drawing depicting the positioning of the connector interposer in relation to electrical components that are to be connected.

It is certified that error appears in the above-identified patent and that said Letters Patent is hereby corrected as shown below:

The sheet of Drawing consisting of Figure 2 should be added as per attached sheet.

Signed and Sealed this

Eleventh Day of February 1986

[SEAL]

Attest:

DONALD J. QUIGG

Attesting Officer

Commissioner of Patents and Trademarks